United States Patent [19]

Masuzawa et al.

[11] Patent Number: 4,574,179

[45] Date of Patent: Mar. 4, 1986

[54] ION BEAM MACHINING DEVICE

[75] Inventors: Takahisa Masuzawa, Kamakura; Ichiro Tsuchiya, Tokyo, both of Japan

[73] Assignee: University of Tokyo, Tokyo, Japan

[21] Appl. No.: 584,962

[22] Filed: Feb. 29, 1984

[30] Foreign Application Priority Data

Jul. 14, 1983 [JP] Japan ................. 58-126848

[51] Int. Cl.[4] .................. H05H 5/02; B23K 9/00
[52] U.S. Cl. .............. 219/121 PG; 219/121 ES;
219/121 PD; 219/121 ET; 204/192 N;
315/5.41; 315/111.31; 315/111.81
[58] Field of Search .............. 219/121 PD, 121 PG,
219/121 PE, 121 PR, 121 ES, 121 EB, 121 ET,
121 EL; 204/192 E, 192 N, 164; 156/345, 646,
643; 315/5.41, 111.81, 111.31

[56] References Cited

U.S. PATENT DOCUMENTS

| 4,447,773 | 5/1984 | Aston | 315/111.31 |
| 4,451,499 | 5/1984 | Morimoto et al. | 204/192 N |
| 4,491,496 | 1/1985 | Laporte et al. | 156/345 |

Primary Examiner—M. H. Paschall
Attorney, Agent, or Firm—Sughrue, Mion, Zinn, Macpeak, and Seas

[57] ABSTRACT

The disclosed ion beam machining device has a plasma-generating chamber, a machining chamber, and an ion-extracting grid disposed between the two chambers, which grid has an insulator layer facing the plasma-generating chamber and a conductor layer facing the machining chamber.

4 Claims, 5 Drawing Figures

ION BEAM MACHINING DEVICE

BACKGROUND OF THE INVENTION

1. Field of the Invention

This invention relates to an improvement of the ion-extracting grid of an ion beam machining device, and more particularly to an ion-extracting grid which produces a high ion beam current density with a low accelerator voltage.

2. Description of the Prior Art

To produce the fine pattern of integrated circuits, the reactive etching process has been widely used. However, the demand for higher degree of integrity in the integrated circuits is ever increasing, and the capability of the reactive etching process in producing fine patterns has reached a limit. An ion beam machining process has been developed for producing patterns or forms which are finer than that producible by the reactive etching process. The ion beam machining process extracts ions of beam form with a high energy (more than 10 eV) from an ion source and uses the ions of beam form for shaping fine patterns, shaping thin films, transforming surface, and the like. Such ion beam machining process has been used fairly frequently for the above-mentioned shaping and transforming. Since its operating principle is in the mutual actions among particles, the ion beam machining process can shape patterns in the order of several tens of angstrom (several 10 Å).

Various ion sources are available for the ion beam machining process. An example is the Kaufman type ion source capable of producing ion beams with energy in a range of 10 eV to more than 500 eV, which ion beams have been used for sputtering to form thin films and fine patterns. The Kaufman type ion source has advantages in that ion beams with an energy level suitable for sputtering can be produced by using a simple control means and that its workability and its reproducibility are high, but it has shortcomings in that a high beam current density cannot be achieved with a low accelerator voltage and that it requires a long working or processing time. In the Kaufman type ion source, if the accelerator voltage is raised with an intention of producing a high beam current, the density of the ion beam current increases but the energy of the ion beams becomes too high and various difficulties such as damage to a mask are caused. Accordingly, there has been a pressing need for the development of an ion source which not only produces ion beams with energy in a range suitable for sputtering but also generates high beam current densities by using a low accelerator voltage.

FIG. 1 shows a schematic sectional view of a conventional ion beam machining device having a Kaufman type ion source. In general, the ion beam machining device of this type has a plasma-generating chamber 1 for generating plasma ions, an ion-extracting grid 2 for extracting the generated ions in the form of ion beams, and a processing chamber 3 for irradiating the ion beams to a workpiece.

The plasma-generating chamber 1 includes a cathode 4 disposed at the central portion of a cylindrical sealing wall 5 which seals the chamber 1. A cylindrical anode 6 is disposed inside of the cylindrical sealing wall 5. An electromagnet 7 surrounds the outside of the sealing wall 5 in such a manner that vertical magnetic field is produced in the plasma-generating chamber 1, so as to produce cyclotron motion of electrons emitted from the cathode 4. To generate glow discharge between the cathode 4 and the anode 6, an anode power source 8 of 40–50 V is connected thereto so as to keep the anode 6 positive relative to the cathode 4.

The ion-extracting grid 2 has a screen grid 9 for defining a plasma boundary and an accelerator grid 10. The screen grid 9 is provided with a large number of holes and kept at the same potential as that of the sealing wall 5. The accelerator grid 10 has a large number of holes for accelerating ions emanating from the plasma boundary by thermal motion thereof. The screen grid 9 and the accelerator grid 10 are spaced by a predetermined distance while the holes of the two grids are aligned each other. An accelerator power source 11 is connected so as to keep the accelerator grid 10 negative relative to the screen grid 9. To prevent reverse movement of electrons from the processing chamber 3, the accelerator grid 10 is kept negative to the workpiece or target by a suppressor power source 12. A target holder 13 is disposed in the processing chamber 3, so as to hold a workpiece 14 thereon, and a mask 15 is placed on the workpiece 14.

The generation of plasma and irradiation of the ion beams on the workpiece 14 will be described now. The ion beam processing device is evacuated by an evacuating means (not shown) through an opening 16 to $10^{-6}$ to $10^{-7}$ Torr, and argon (Ar) gas is fed therein through another opening 17. As being emitted from the cathode 4 by the thermoelectronic emission, the electrons are caused to make cyclotron motion by the magnetic field of the electromagnet 7 until they collide the anode 6. In the course of motion, the electrons are accelerated by the electric field between the cathode 4 and the anode 6, and their collision with argon atoms ionizes the latter so as to produce Ar+ ions, whereby glow discharge is caused and a low-ionization plasma is produced.

Thin ion sheaths are formed between the thus produced plasma and the sealing wall 5 and between the plasma and the screen grid 9, and plasma boundaries are defined by such ion sheaths. Ions emitted from the plasma boundaries by thermal motion are accelerated by a gross accelerator voltage corresponding to the difference between the plasma potential and the potential of the accelerator gird 10 (more specifically, a value obtained by subtracting the suppressor power source voltage from the difference between the plasma potential and the potential of the accelerator grid 10), so that the thus accelerated ions are extracted in the form of ion beams. The ion beams are irradiated onto the workpiece 14 as an ion shower in the processing chamber 3. Accordingly, those portions of the workpiece 14 which are not covered by the mask 15 are directly bombarded by the ion beams, and the workpiece 14 itself is etched to produce a fine pattern thereon after the shape of the mask 15.

The maximum current density J (A/cm$^2$) available in the Kaufman type ion beam machining device is given by the following equation.

$$J = n(\pi\epsilon_o/9)(2q/Mi)^{\frac{1}{2}}(ds/le)^2 V_T^{3/2} \qquad (1)$$

here,
n: density of holes in the grids,
q: electric charge of the ion,
Mi: mass of the ion,
ds: diameter of the hole of the grid,
$V_T$: Maximum accelerator voltage,
le: $(lg + ds^2/4)^{\frac{1}{2}}$, lg: distance between the screen grid and the accelerator grid.

As can be seen from the equation (1), a first method to increase the maximum current density J is to increase the grid hole density n (number of grid holes per unit area). There is a certain limit as to the material of the grid, because the grid is required to have a certain mechanical strength, a certain heat resistivity, and a certain durability against sputtering due to ion beams being extracted. To meet the above requirements of the physical properties, carbon grids have been used, and from the standpoint of machining there is a certain limit in increasing the number of holes per unit area of the carbon grid, or the grid hole density. Especially, when the two grids, i.e., the screen grid 9 and accelerator grid 10, are overlaid one over the other while aligning the holes thereof, it is extremely difficult to make the grid holes small.

As a second method for increasing the maximum current density J, one may consider the decrease of the distance lg between the screen grid 9 and the accelerator grid 10. However, a certain minimum spacing is indispensable between the two grids for preventing breakdown of the insulation therebetween.

As a third method for increasing the maximum current density J, the use of a high accelerator voltage may be considered. However, this method tends to cause an excessively high accelerating energy of the ion beams which causes mask contamination by sputtering or the like difficult.

Thus, the ion-extracting grid in the conventional Kaufman type ion source has shortcomings in that high beam current densities cannot be obtained and that a long processing time is necessary for sputtering. Besides, the construction, which uses the two perforated grids to be assembled while aligning the holes thereof, requires high accuracy both in the machining and in mounting onto the ion beam machining device, and the material for the ion-extracting grid is limited.

As a means to solve the above-mentioned shortcomings, it has been proposed to eliminate the screen grid so as to form the ion-extracting grid by the accelerator grid alone. However, the elimination of the screen grid results in a number of shortcomings, such as an increased angle of beam divergence, exposure of the grid itself to machining by the ions resulting in a shortened service life of the grid, contamination of the workpiece, and the like.

SUMMARY OF THE INVENTION

Therefore, an object of the present invention is to obviate the above-mentioned shortcomings of the prior art by providing an improved ion beam machining device adapted to produce ion beams with energy in a range suitable for sputtering while enabling a high beam current density at a low accelerator voltage and a small angle of ion beam divergence, so as to effectively irradiate ion beams onto a workpiece.

To fulfil the above object, an ion beam machining device according to the present invention comprises a plasma-generating chamber for producing plasma ions, an ion-extracting grid for extracting the produced ions as ion beams, a machining chamber for irradiating the extracted ion beams onto a workpiece, said ion-extracting grid having an insulator layer facing the plasma-generating chamber, a conductor layer facing the machining chamber, and a plurality of holes extending through both said insulator layer and said conductor layer, and a means for connecting said conductor layer to an electric potential which is negative relative to potential of said plasma.

In a preferred embodiment of the invention, the above-mentioned insulator layer of the grid is thicker than said conductor layer thereof.

In another embodiment of the invention, the above-mentioned insulator layer of said grid has a thickness which is more than 20% of diameter of said hole thereof.

BRIEF DESCRIPTION OF THE DRAWINGS

For a better understanding of the invention, reference is made to the accompanying drawings, in which.

Throughout different views of the drawings, 1 and 21 are plasma-generating chambers, 2 and 22 are ion-extracting grids, 3 and 23 are machining chambers, 4 is a cathode, 5 is a sealing wall, 6 is an anode, 7 is an electromagnet, 8 is an anode power source, 9 is a screen grid, 10 is an accelerator grid, 11 is an accelerator power source, 12 is a suppressor power source, 14 is a workpiece, 15 is a mask, 16 and 17 are openings, 24 is an electrical insulator layer, 25 is a conductor layer, 26 is a hole, 27 is a plasma boundary, 30 is an ion-extracting grid, 31 is a conductor, and 32 is a hole.

DESCRIPTION OF THE PREFERRED EMBODIMENTS

Figure 1:
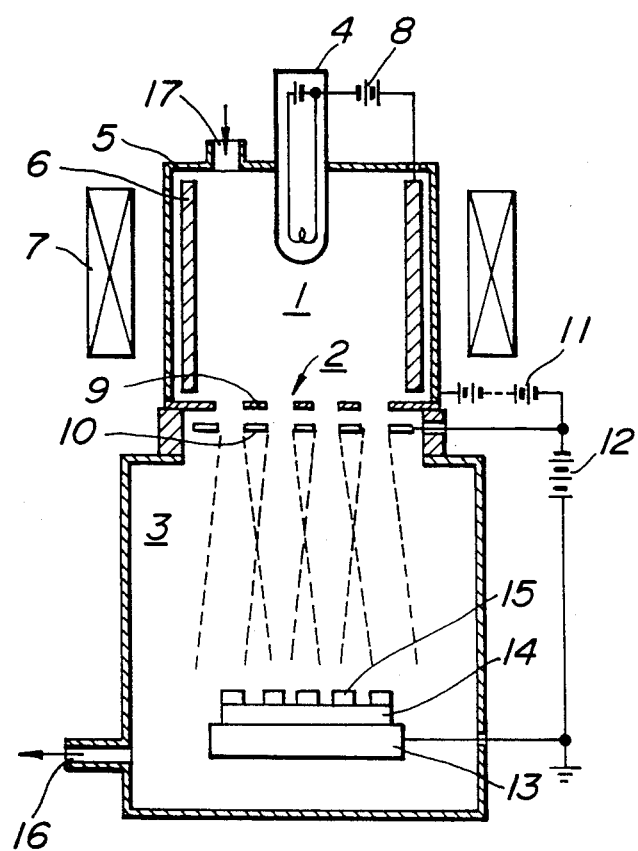
FIG. 1 is a schematic sectional view of an ion beam machining device which uses a Kaufman type ion source of the prior art.
Figure 2:
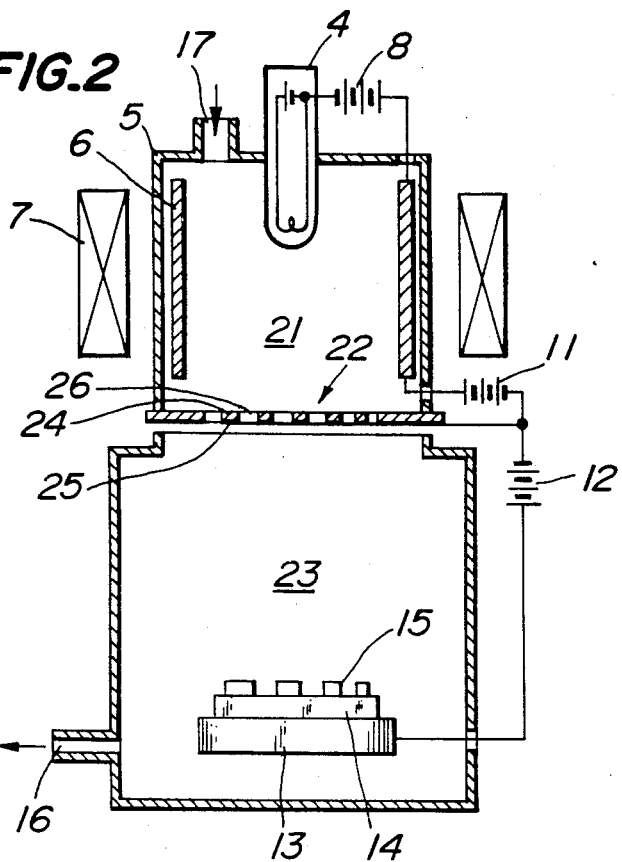
FIG. 2 is a schematic sectional view of an embodiment of the ion beam machining device according to the present invention which uses a two-layered ion-extracting grid.

Referring to FIG. 2 showing a sectional view of an ion beam machining device according to the present invention, the device essentially comprises a plasma-generating chamber 21, an ion-extracting grid 22, and a machining chamber 23. Since the construction of the plasma-generating chamber 21 and the machining chamber 23 can be substantially the same as that of the plasma-generating chamber 1 and the processing chamber 3 of the prior art as shown in FIG. 1, the details of the two chambers will not be dealt with here and the ion-extracting grid 22 in the device of the invention will be described in detail. The ion-extracting grid 22 has an integral two-layered structure including a comparatively thick electrical insulator layer 24 disposed on the side of the plasma-generating chamber 21 and a comparatively thin conductor layer 25 disposed on the side of the machining chamber 23. A plurality holes 26 are bored through the insulator layer 24 and the conductor layer 25. The electrical insulator layer 24 acts to control the shape of the plasma boundary 27 and prevents the ions from directly entering into conductor layer 25. Thus, the electrical insulator layer 24 in the ion-extracting grid 22 of the invention fulfils the same function as that of the screen grid 9 of FIG. 1. With the increase of the density of the holes 26 (the number of the holes 26 per unit area), the density of the beam current increases, so that it is desirable to form a large number of small holes or holes with small diameters. Various kinds of insulating materials can be used to form the electrical insulator layer 24 as long as sufficient electric insulating strength is satisfied, and since a certain amount of heat-generation is expected therein during use, insulating material having a high heat resistivity and a small thermal deformation is preferable.

The conductor layer 25 is to provide an accelerating potential at the lower portion of the ion-extracting grid 22, and it is not required to have a high mechanical strength. Besides, the electrical insulator layer 24 is formed so as to prevent direct bombardment of the conductor layer 25 with the ions, so that conductor layer 25 is not required to have a high durability against sputtering. Accordingly, the only requirement for the conductor layer 25 is a good electric conductivity, so that a wide range of materials can be used therefor.

Figure 3:
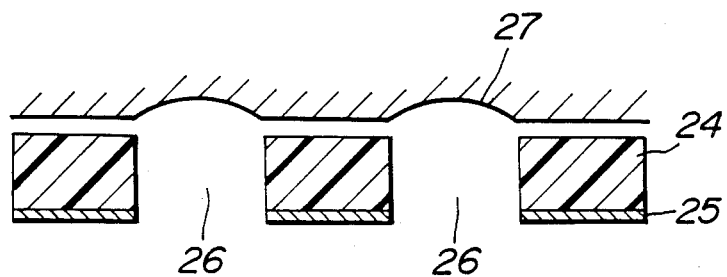
FIG. 3 is an explanatory sectional view showing the shape of an ion-extracting grid according to the present invention and the shape of plasma boundary.

FIG. 3 also shows the shape of the plasma boundary 27 in the proximity of the ion-extracting grid 22. As a plasma is generated, ions from the plasma ion source collide with the surface of the electrical insulator layer 24, so that the surface of the electrical insulator layer 24 is at about the same potential as the potential of the cathode filament. Thus, the width of the ion sheath above the electrical insulator layer 24 becomes narrower than the width of the ion sheath above the hole 26, and the plasma boundary 27 above each of the holes 26 becomes concave toward the cathode 4 as shown in FIG. 3. The concave portion of the plasma boundary 27 thus formed has a similar shape as that of the plasma boundary formed by the two grids of FIG. 1. Thus, the provision of the electrical insulator layer 24 fulfils substantially the same effects as the provision of two screen grids. Accordingly, the ion current flowing into the grid through the sidewall of the conductor layer 25 is reduced, and a larger ion current density is produced from a given total current as compared with that obtainable by the conventional ion-extracting grids. Besides, wearing off of the grid due to the sputtering is suppressed and the heat generation at the grid is reduced. Furthermore, since the potential at the surface of the electrical insulator layer 24 is the same as the potential of the filament, the energy of the incident ions becomes the same as that of the surface potential of the electrical insulator layer 24, namely the same as the filament potential of the cathode.

It is noted here that the thickness of the electrical insulator layer 24 and the thickness of the conductor layer 25 are very important. When the conductor layer 25 is too thick, the current flowing into the grid through the sidewall thereof becomes large and undesirable problems, such as contamination by the sputtered conductor material, heat generation in the grid and increased angle of ion beam divergence, are caused. Accordingly, it is preferable to make the conductor layer 25 thin. If the electrical insulator layer 24 is too thin, the distribution of the electric potential in and out of the electrical insulator layer 24 becomes very irregular, resulting in an undesirably large angle of beam divergence. Thus, it is preferable that the electrical insulator layer 24 has a thickness of certain magnitude. When the electrical insulator layer 24 is thick, ions collide with the sidewall of the hole 26, so that the potential of the sidewall of the hole 26 becomes the same as the surface potential of the positive electrode, and the ion beam being extracted is focussed by the electrostatic lens effect, so as to further improve the directivity of the ion beams. In this case, the thickness of the electrical insulator layer 24 should be determined by considering its relationship with the diameter of the hole 26, and the thickness of the electrical insulator layer 24 is preferably more than 20% of the diameter of the hole 26.

To obtain a sufficient ion current, it becomes necessary sometimes to sufficiently reduce the plasma potential on the side of the machining chamber by neutralizing. Such neutralization can be effected by disposing a conventional heater filament in the processing chamber 23 at a position beneath the ion-extracting grid 22 so as to produce a sufficient amount of thermoelectrons.

The inventors carried out a series of experiments to compare the performance of an ion beam machining device according to the invention, which was of Kaufman type and equipped with an ion-extracting grid of the invention, with that of an ion beam machining device with a conventional ion-extracting grid. In the experiments for the comparison of the invention and the prior art, only the ion-extracting grids, the accelerator voltage, and the suppressor voltage were different, while all other conditions were the same for both cases of the invention and the prior art.

EXPERIMENTS (Test conditions)

| (i) The ion-extracting grid of the invention | |
| --- | --- |
| 1. Hole diameter, | 0.4 mm |
| 2. Hole pitch, | 0.6 mm |
| 3. Insulator layer, | Alumina (kyocera A0479) thickness t = 0.25 mm |
| 4. Conductor layer, | Nickel plated, with a thickness t = 0.01 mm |
| (ii) Conventional ion-extracting grid (two-grid system) | |
| 1. Hole diameter, | 1.0 mm |
| 2. Hole pitch, | 1.5 mm |
| 3. Spacing between the grids, | 0.6 mm |

(Measuring method)

(i) Maximum current density

In the measurement, a Faraday cup with a probe diameter of 3 mm was used. The measuring position was at a point spaced from the grid by 8 cm in the case of the invention, and at a point spaced from the accelerator grid by 10 cm in the case of conventional device. Theoretically, because of the above difference of the measuring position, the measured value of the conventional device becomes smaller than that of the device of the invention by a factor of about 1.56, so that the measured value of the conventional device was multiplied by 1.56 for the comparison on the same basis.

(ii) Current density distribution

The current density was measured by using the Faraday cup at five positions, namely at the center, and at points laterally spaced from the conter by 2 cm and 4 cm, and profiles of the current density distributions were prepared.

(iii) Beam divergence angle

The beam divergence angle α was determined by the following equation (2).

$$\alpha = \tan^{-1}[(R_\alpha - R_\beta)/L] \qquad (2)$$

here, $R_\alpha$: the radius of a circle through which 95% of the entire beam passes, $R_\beta$: the radius of the ion source, and L: spacing from the ion source to the Faraday cup.

(iv) The total current was determined by integrating the beam profile.

TABLE 1

| Specimen | Accelerator voltage (see Note) | Beam current (mA) | Maximum current density (mA/cm$^2$) | Total current (mA) | Half-angle of beam divergence (degree) |
|---|---|---|---|---|---|
| The invention | | 10.5 | 0.77 | 6.3 | 6.6 |
| | $V_t = 150$ V | 18.1 | 1.08 | 10.1 | 7.0 |
| | | 24.5 | 1.39 | 15.5 | 7.4 |
| | $V_n = 120$ V | 32.0 | 1.84 | 20.5 | 8.4 |
| | | 39.7 | 2.23 | 27.3 | 8.2 |
| | | 9.2 | 1.21 | 5.8 | 3.4 |
| | $V_t = 250$ V | 19.7 | 1.46 | 12.5 | 6.9 |
| | | 27.4 | 1.72 | 16.5 | 7.8 |
| | $V_n = 200$ V | 34.0 | 2.06 | 20.4 | 7.7 |
| | | 44.9 | 2.89 | 28.0 | 8.8 |
| Prior art | | 10.0 | 0.59 | 7.7 | 7.4 |
| | $V_t = 400$ V | 19.6 | 0.91 | 15.7 | 10.3 |
| | $V_n = 330$ V | 29.2 | 1.15 | 23.0 | 11.8 |
| | | 36.2 | 1.19 | 27.7 | 13.3 |
| | | 9.8 | 0.74 | 8.0 | 8.0 |
| | $V_t = 550$ V | 24.8 | 1.13 | 18.3 | 10.0 |
| | $V_n = 450$ V | 39.3 | 1.66 | 29.3 | 11.6 |
| | | 49.2 | 2.35 | 41.6 | 10.9 |

Note:
(i) Total accelerator voltage (Vt): voltage applied across the anode and the grid
(ii) Net accelerator voltage (Vn): actual accelerator voltage, i.e., total accelerator voltage (Vt) minus suppressor voltage

TABLE 2

| Specimen | Accelerator voltage (V) | Beam current (mA) | Maximum current density (mA/cm$^2$) |
|---|---|---|---|
| The invention | $V_t = 150, V_n = 120$ | 48.0 | 4.99 |
| | $V_t = 250, V_n = 200$ | 55.2 | 5.74 |
| Prior art* | $V_t = 400, V_n = 330$ | 48.0 | 4.99 |
| | $V_t = 550, V_n = 450$ | 55.9 | 5.81 |

*A sufficient amount of thermoelectrons were emitted by using a heater filament.

(Result of experiments)

Table 1 shows the result of the experiments on the maximum current density, the total current, and the beam divergence angle, while Table 2 shows the maximum current density at a position immediately behind the passage of the grid.

In the measurement of the specimen of the prior art, a higher accelerator voltage than that for the specimen of the invention was used, so that the measured values could not be compared directly except the half-angle of beam divergence. However, it is apparent from the equation (1) that the beam current is proportional to the 3/2 power of the accelerator voltage, so that after the correction by using the equation (1), the measured values were compared.

(i) Maximum current density

In the case of the net accelerator voltage $V_n$ of 120 V, the maximum current density of the invention was improved by a factor of 4 to 6 times, and in the case of $V_n = 200$ V, the improvement was 2.6 to 3.3 times. The maximum current density immediately after passing the grid was also improved by using the ion-extracting grid of the invention; namely by a factor of 4.5 to 6.2 times in the case of $V_n = 120$ V, and by a factor of 2.4 to 3.3 times in the case of $V_n = 200$ V.

Thus, when the net accelerator voltage $V_n$ was comparatively low, e.g., at $V_n = 120$ V, the result obtained substantially agreed with the theoretical value of the equation (1), while when the net accelerator voltage $V_n$ was comparatively high, e.g., at $V_n = 200$ V, the value obtained was somewhat lower than the theoretical value.

(ii) Total current

As compared with the case of the prior art, the total current of the case of the invention was improved by a factor of 2.8 to 4 times for $V_n = 120$ V, and by a factor of 1 to 2 times for $V_n = 200$ V.

(iii) Half-angle of current divergence

In the case of using the ion-extracting grid of the invention, the half-angle of current divergence was kept substantially constant for different levels of beam current, while in the case of the prior art, a tendency of the increase of the half-angle of divergence with the increase of the beam current was noticed. Besides, the use of the grid of the invention improved the half-angle of current divergence by about 3 degrees, as compared with the prior art. This result means that the divergence of the ion beam was suppressed and the directivity of the ion beams was further improved.

(iv) Beam profile

Figure 4:
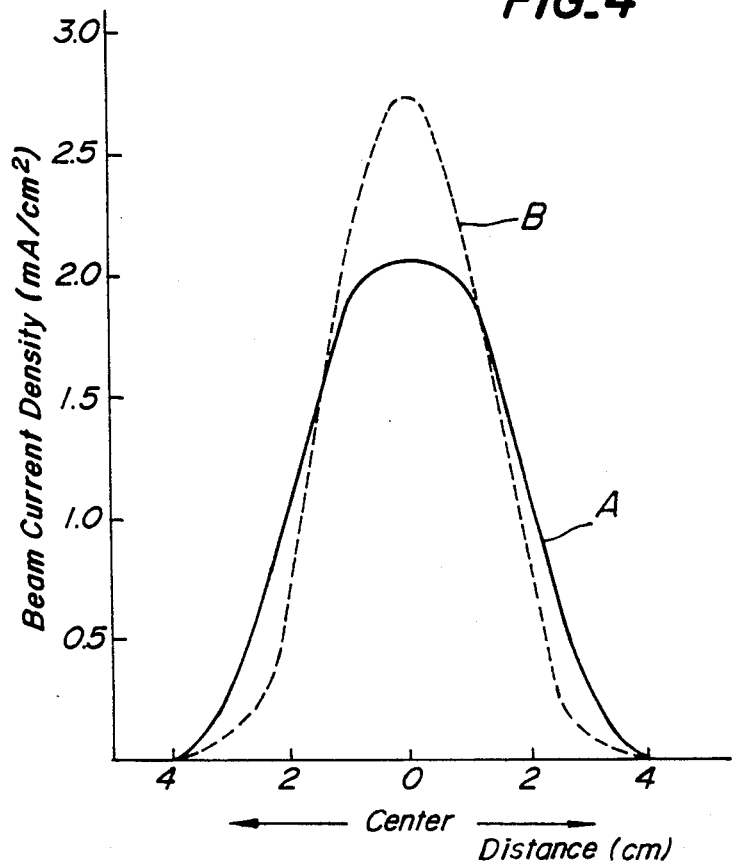
FIG. 4 is a graph showing distributions of beam current densities.

FIG. 4 shows the beam profile, in which the ordinate represents the beam current density while the abscissa represents the distance from the center. The case of the prior art as shown by the solid line A was for the net accelerator voltage of 450 V and the beam current of 44.6 mA, while the case of the invention as shown by the dash line was for the accelerator voltage of 200 V and the beam current of 44.9 mA. The graph of FIG. 4 shows that the distribution of the beam current density in the case of the invention had a more steep rise as compared with that of the prior art, so that the divergence was suppressed and the directivity was improved by the grid of the invention. The same tendency was noticed even when the beam current and the accelerator voltage were changed.

In the experiments, a fact was noticed that when the net accelerator voltage $V_n = 150$ V, the rate of increase of the maximum current density and the total current over those of the prior art substantially agreed with the theoretical value, but when the net accelerator voltage $V_n = 200$ V, the rate of increase was somewhat reduced. The reason for such fact seems to be in that the generation of plasma ions in the plasma-generating chamber does not vary in proportion to the amount of ion extraction from the plasma-generating chamber by the grid.

Figure 5:
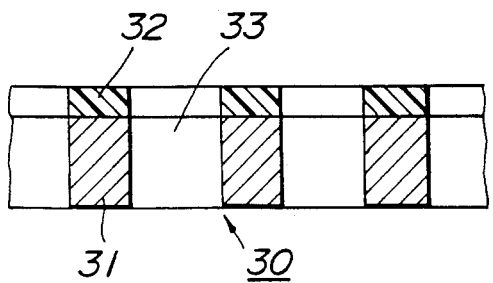
FIG. 5 is a schematic sectional view of ion-extracting grid.

FIG. 5 shows a schematic sectional view of another embodiment of the ion-extracting grid according to the present invention. The ion-extracting grid of the preceding embodiment was made by depositing the conductor layer on the insulator layer, but the embodiment of FIG. 5 was made by depositing the insulator layer on the conductor layer. More particularly, the ion-extracting grid 30 of FIG. 5 was made by boring holes 32 with a diameter of about 0.2 mm through a conductor layer 31 formed of a stainless steel plate with a thickness of for instance 0.1 mm, with an opening density or porosity of 6.25 times that of the prior art (having holes with a diameter of 1 mm), and then depositing a 3 $\mu$m thick insulator layer 32 by vacuum evaporation of silica (SiO$_2$).

The experiments proved that the ion-extracting grid 30 of this embodiment resulted in a considerable improvement of the performance of the conventional ion-extracting grid, especially in the parallelism of the beam profile, the beam current density, the service life, the prevention of target contamination, and the like. More particularly, the beam profile obtained by this embodiment was more steep than that of the prior art, and the beam current density of 1.6 mA/cm$^2$ was obtained for the net accelerator voltage Vn=120 V.

It should be noted here that when the insulator layer is very thin as in the case of this embodiment, extra care should be taken of the durability. For instance, the insulator layer is preferably formed by a method accompanied with a comparatively low residual stress such as the chemical vapour deposition (CVD), or by a method using an insulating material whose coefficient of thermal expansion is similar to that of the conductor layer, or by a method using a silicon (Si) substrate while thermally oxidizing one side surface thereof and doping boron (B) or phosphorus (P) onto the opposite side surface thereof so as to make the substrate hard to peel off under stressed conditions.

As described in detail in the foregoing, in the ion-extracting grid according to the present invention, the insulator layer thereof fulfils the function of the screen grid of the prior art, so that the ion-extracting grid of the invention is equivalent to an integral formation of the screen grid and the accelerator grid of the prior art. By using the structure of the invention, the hole density or opening density of small holes to be bored through the ion-extracting grid can be improved, ion beams with a high beam current density can be extracted from a low-potential plasma by using a low accelerator voltage, and the processing speed can be improved without causing any harm on the mask and the like. With the present invention, the manufacture and the mounting of the ion-extracting grid can be made easier, because the ion-extracting grid can be formed as an integral member, for instance by depositing the conductor layer equivalent to the accelerator grid onto an insulator substrate through evaporation or plating in an integral fashion. Furthermore, the conductor layer acting as the accelerator grid has such structure that it is hardly exposed to direct contact with the plasma ions, so that the range of the materials to be selected for making the ion-extracting grid is broadened. Further, when the thickness of the insulator layer of the ion-extracting grid of the invention is made more than 20% of the diameter of the holes of the grid, the directivity of the ion beams extracted thereby is further improved, and efficient irradiation of the ion beams onto a workpiece can be ensured even when a processing chamber with a large distance between the ion-extracting grid and the workpiece is used.

The ion source to be used in the ion beam machining device of the invention is not restricted to the Kaufman type ion source, and for instance, an ion source which generates plasma by using a rectangular waveguide and a microwave can be used in the invention. The gas to be sealed in the ion beam machining device of the invention is not restricted to inert gases such as argon (Ar), and for instance, an active gas is used for effecting reactive etching. The ion beam machining device of the invention can be used not only for the etching but also for thin film formation by sputter deposition and for surface cleaning.

Although the invention has been described with a certain degree of particularity, it is understood that the present disclosure has been made only by way of example, and that numerous changes in details of construction and the combination and arrangement of parts may be resorted to without departing from the scope of the invention as hereinafter claimed.

What is claimed is:

1. An ion beam machining device, comprising: a plasma-generating chamber for producing plasma ions, an ion-extracting grid for extracting the produced ions as ion beams, a machining chamber for irradiating the extracted ion beams onto a workpiece, said ion-extracting grid having an electrical insulator layer facing the plasma-generating chamber and an electrical conductor layer, and a plurality of holes extending through both said insulator layer and said conductor layer, and means for connecting said conductor layer to a workpiece through a suppressor power source to generate an electric potential which is negative relative to potential of said plasma, wherein said insulator layer of said grid is thicker than said conductive layer thereof to focus said ion beam for machining.

2. An ion beam machining device as set forth in claim 1, wherein said insulator layer of said grid has a thickness which is more than 20% of the diameter of said hole thereof.

3. An ion beam machining device as set forth in claim 1, wherein said insulator layer is an alumina layer and said conductor layer is a nickel film plated on said alumina layer.

4. An ion beam machining device as set forth in claim 1, wherein said conductor layer is a stainless steel plate and said insulator layer is a silica film vacuum deposited on said conductor layer.

* * * * *